United States Patent [19]

Jeng et al.

[11] Patent Number: 5,637,514
[45] Date of Patent: Jun. 10, 1997

[54] METHOD OF FORMING A FIELD EFFECT TRANSISTOR

[75] Inventors: Nanseng Jeng; Viju K. Mathews; Pierre C. Fazan, all of Boise, Id.

[73] Assignee: Micron Technology, Inc., Boise, Id.

[21] Appl. No.: 544,599

[22] Filed: Oct. 18, 1995

[51] Int. Cl.⁶ .......................... H01L 21/8232; H01L 21/84
[52] U.S. Cl. .......................... 438/163; 438/305; 438/595
[58] Field of Search .................................. 437/21, 41, 44, 437/239

[56] References Cited

U.S. PATENT DOCUMENTS

| 4,599,118 | 7/1986 | Han et al. . | |
| 5,322,807 | 6/1994 | Chen et al. | 437/40 |
| 5,552,329 | 9/1996 | Kim et al. | 437/29 |

FOREIGN PATENT DOCUMENTS

| 58-25265A | 2/1983 | Japan . |
| 62-90974A | 4/1987 | Japan . |

OTHER PUBLICATIONS

Wolf, "Silicon Processing for the VLSI Era, vol. 2: Process Integration", pp. 66–71 1990 month unknown.
Wolf et al., "Silicon Processing for the VLSI Era, vol. 1: Process Technology", pp. 216–218 1986 month unknown.

*Primary Examiner*—John Niebling
*Assistant Examiner*—Richard A. Booth
*Attorney, Agent, or Firm*—Wells, St. John, Roberts, Gregory & Matkin, P.S.

[57] ABSTRACT

A method of reducing diffusion of impurity dopants within a semiconductive material beneath a field effect transistor gate in a process of forming a field effect transistor includes, a) providing a bulk monocrystalline silicon substrate; b) providing a gate oxide layer over the silicon substrate; c) providing a patterned gate over the gate oxide layer, the gate having sidewalls; d) providing a pair of diffusion regions within the silicon substrate adjacent the gate sidewalls; and e) subjecting the wafer to an oxidizing atmosphere at a pressure of from about 5 atmospheres to about 30 atmospheres and at a temperature of from about 650° C. to about 750° C. for a period of time from about 5 minutes to about 30 minutes effective, i) to oxidize the gate sidewalls, ii) to oxidize the semiconductive material substrate adjacent the gate sidewalls, and iii) to thicken the gate oxide layer adjacent the gate sidewalls.

21 Claims, 2 Drawing Sheets

METHOD OF FORMING A FIELD EFFECT TRANSISTOR

TECHNICAL FIELD

This invention relates to methods of forming field effect transistors, and to methods of reducing diffusion of impurity dopants within a semiconductive material beneath a field effect transistor gate in processes of forming field effect transistors.

BACKGROUND OF THE INVENTION

Field effect transistors are comprised of a pair of diffusion regions, referred to as a source and a drain, spaced apart within a semiconductive substrate. The transistors include a gate provided adjacent the substrate separation region between the diffusion regions for imparting an electric field to enable current to flow between the diffusion regions. The substrate material adjacent the gate and between the diffusion regions is referred to as the channel. The semiconductive substrate typically comprises a bulk monocrystalline silicon substrate having a light conductivity dopant impurity concentration. Alternately, the substrate can be provided in the form of a thin layer of lightly doped semiconductive material over an underlying insulating layer. Such are commonly referred to as semiconductor-on-insulator (SOI) constructions.

Integrated circuitry fabrication technology continues to strive to increase circuit density, and thereby minimize the size and channel lengths of field effect transistors. Improvements in technology have resulted in reduction of field effect transistor size from long-channel devices (i.e., channel lengths greater than 2 microns) to short-channel devices (i.e., channel lengths less than 2 microns). As field effect transistor channel lengths (i.e., gate lenghts or wordline widths) became smaller than about 2 microns, so-called short channel effects began to become increasingly significant. As a result, device design and consequently process technology had to be modified to take these effects into account so that optimum device performance could continue to be obtained. For example, the lateral electrical field in the channel region increases as a result of smaller transistor channel length as the supply voltage remains constant. If the field becomes strong enough, it can give rise to so-called hot-carrier effects. Hot-carrier effects often lead to gate oxide degradation, as these energetic carriers can be injected into gate oxide and become permenant charges.

A recognized prior art solution to this problem is to subject the poly gate after its formation to a thermal oxidation step. Such will effectively reoxidize the source and drain regions as well as grow a layer of thermal oxide on the gate sidewalls. The oxidation has the effect of rounding the poly gate edge corners in effectively oxidizing a portion of the gate and underlying substrate, thereby increasing the thickness of the gate oxide layer at least at the edges of the gate. Such reduces the gate-to-drain overlap capacitance and strengthens the gate oxide at the polysilicon gate edge. The latter benefits are effectively obtained because oxidation-induced encroachment gives rise to a graded gate oxide under the polysilicon edge. The thicker oxide at the gate edge relieves the electric-field intensity at the corner of the gate structure, thus reducing short channel effects.

The prior art technique for accomplishing such reoxidation is similar to the conventional wet and dry oxidation at atmoshperic pressure and at a temperature of 800° C. or greater. The typical process exposure is for 10 minutes to grow a layer of oxide of from 50 to 200 Angstroms thick on the sidewalls of the patterned gate.

Another method which addresses hot-carrier effects is provision of lightly doped drain (LDD) regions within the substrate relative to the channel region in advance of the source and drain regions. The LDD regions are provided to be lighter conductively doped (i.e., less concentration) than the source and drain regions. This facilitates sharing of the voltage drop by the drain and the channel, as opposed to the stark voltage drop at the channel occurring in non-LDD n-type transistors. The LDD regions absorb some of the voltage drop potential into the drain, thus effectively eliminating hot carrier effects. As a result, the stability of the device is increased.

However, further shrinking of the gate length (i.e., shorter channel length) can lead to sufficient lateral diffusion of LDD and other dopants across the channel. Diffusion of a given material is in large part temperature driven, and the conventional reoxidation process for oxidizing the gate sidewalls as described above undesirably exacerbates this undesired diffusion.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a field effect transistor relative to a wafer comprises the following steps:

providing a semiconductive material substrate;

providing a gate dielectric layer over the semiconductive material substrate;

providing a patterned gate over the gate dielectric layer, the gate having sidewalls;

providing a pair of diffusion regions within the semiconductive material substrate adjacent the gate sidewalls; and subjecting the wafer to an oxidizing atmosphere at a pressure of at least about 5 atmospheres and at a temperature of from about 600° C. to about 800° C. for a period of time effective, a) to oxidize the gate sidewalls, b) to oxidize the semiconductive material substrate adjacent the gate sidewalls, and c) to thicken the gate dielectric layer adjacent the gate sidewalls.

Figure 1:
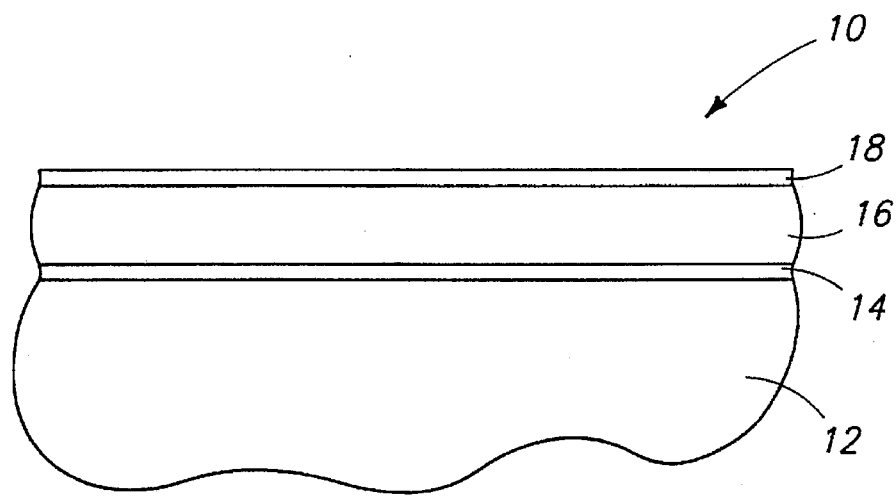
FIG. 1 is a diagrammatic sectional view of a semiconductor wafer fragment at one processing step in accordance with the invention.

Referring to FIG. 1, a semiconductor wafer in process is indicated generally with reference numeral 10. Such is comprised of a bulk monocrystalline silicon substrate 12, an overlying gate dielectric layer 14, a gate layer 16, and a metal silicide layer 18. Gate dielectric layer 14 is preferably from 50 Angstroms to 200 Angstroms thick, and preferably comprises $SiO_2$. Gate layer 16 preferably comprises polysilicon deposited to a thickness of from 200 Angstroms to 3000 Angstroms. Silicide layer 18 preferably ranges from 500 Angstroms to 2000 Angstroms thick, and comprises $WSi_x$. In a preferred embodiment, substrate 12 comprises the bulk monocrystalline silicon portion of a monocrystalline silicon wafer having a desired blanket low channel concentration doping, with $1.0 \times 10^{17}$ ions/cm$^3$ being an example. Other desired implants, such as a $V_t$ implant, could of course be provided. Other semiconductive material substrates could also be utilized in accordance with the invention, such as silicon-on-insulator (SOI) by way of example only.

Figure 2:
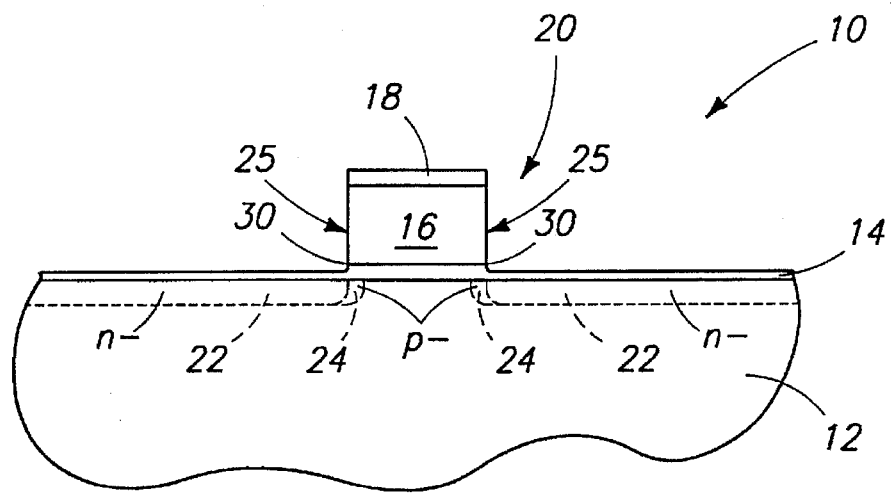
FIG. 2 is a view of the FIG. 1 wafer fragment at a processing step subsequent to that shown by FIG. 1.

Referring to FIG. 2, gate layers 16 and 18 are patterned to define a gate 20 over gate dielectric layer 14 and substrate 12. Such patterning is typically and preferably done using photoresist and an etch which is substantially selective to the underlying oxide of gate dielectric layer 14. However as illustrated, gate oxide layer 14 is very thin and some over-etching thereof occurs to assure complete patterning of gate layers 16 and 18. For purposes of a continuing discussion, gate 20 includes gate sidewalls 25 and sharp lower gate edges 30. Subsequently, and presuming formation of an NMOS transistor, a p– implant 24 and an LDD n– implant 22 are provided through the remaining exposed gate oxide layer 14 adjacent gate 20. LDD regions 22 constitute one pair of diffusion regions within silicon substrate 12 adjacent gate sidewalls 25, while diffusion regions 24 constitute another pair of diffusion regions within silicon substrate 12 adjacent gate sidewalls 25. An example common dose for each of regions 22 and 24 is from $10^{12}$–$10^{14}$ ions/cm$^3$. Regions 22 and 24 diffuse laterally inward as shown from inherent wafer heating during processing.

Figure 3:
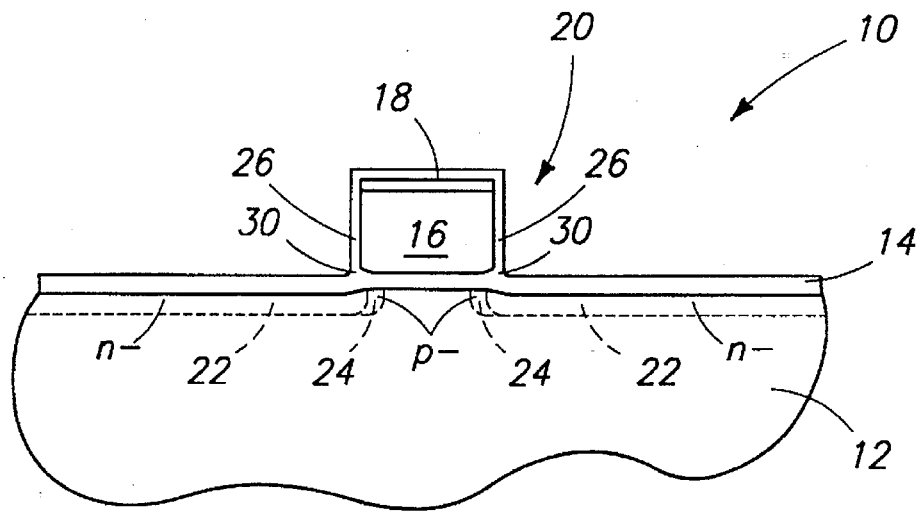
FIG. 3 is a view of the FIG. 1 wafer fragment at a processing step subsequent to that shown by FIG. 2.

Referring to FIG. 3, wafer 10 is subjected to an oxidizing atmosphere at a pressure of at least about 5 atmospheres and at a temperature of from about 600° C. to about 800° C. One preferred oxidizing atmosphere comprises $H_2$ torched into the reaction chamber, with the chamber also including oxygen. Such processing is continued for a period of time effective to oxidize gate sidewalls 25 to produce oxidized gate sidewall regions 26. Such further effectively rounds lower gate edges 30 by oxidation of gate material 16. Such further oxidizes semiconductive material substrate 12 adjacent gate sidewalls 25 and effectively thickens gate dielectric layer 14 at least immediately adjacent former gate sidewalls 25. Also, thickening of layer 14 outwardly of gate 20 occurs.

An example preferred pressure range for the reoxidation is from about 5 atmospheres to about 30 atmospheres, with from about 15 atmospheres to about 25 atmospheres being most preferred. Such facilitates using of temperatures lower than 800° C. as is required by the prior art reoxidation steps conducted at atmospheric pressure. Accordingly, the preferred temperature for such processing will be below 800° C., with a range of from 650° C. to about 750° C. being more preferred. Processing time effective to produce an oxide layer 26 having a thickness of from about 50 Angstroms to about 200 Angstroms is expected to be from about 5 minutes to about 30 minutes. Such collective low temperature processing will facilitate reducing or minimizing diffusion of impurity dopants within diffusion regions 22 and 24 from moving laterally inward, which would effectively shorten the channel length, or downward relative to substrate 12.

Figure 4:
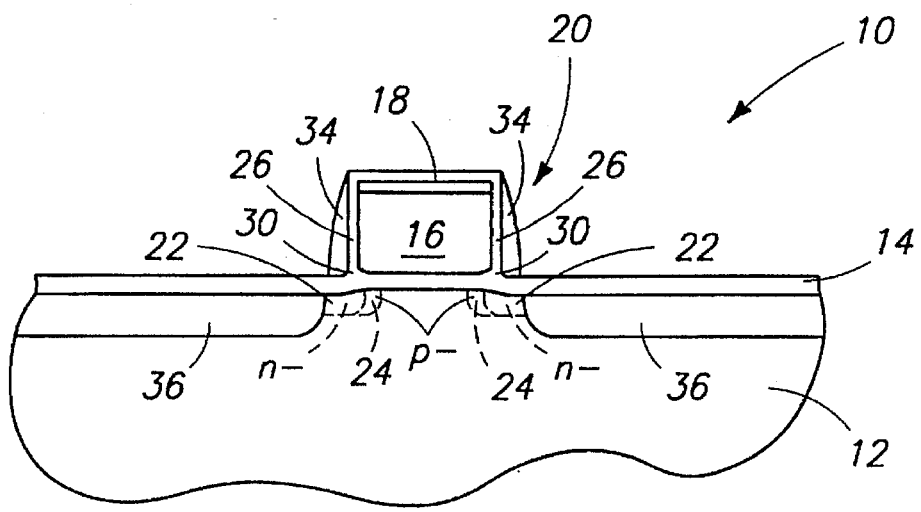
FIG. 4 is a view of the FIG. 1 wafer fragment at a processing step subsequent to that shown by FIG. 3.

Referring to FIG. 4, a subsequently deposited insulator layer, such as oxide or silicon nitride, is deposited and anisotropically etched to produce electrically insulative sidewall spacers 34 over oxidized sidewall gate regions 26. Subsequently, heavy n+ implanting (for NMOS) is conducted to provide diffusion regions 36 within substrate 12 to substantially complete field effect transistor formation.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a field effect transistor comprising the following steps:

forming a gate dielectric layer over a semiconductive material substrate;

forming a transistor gate over the gate dielectric layer, the gate having sidewalls;

forming a first pair of diffusion regions within the semiconductive material substrate adjacent the gate sidewalls, the first pair of diffusion regions comprising LDD regions;

after forming the LDD regions, subjecting the wafer to an oxidizing atmosphere at a pressure of at least about 5 atmospheres and at a temperature of from about 600° C. to about 800° C. for a period of time effective, a) to oxidize the gate sidewalls, b) to oxidize the semiconductive material substrate adjacent the gate sidewalls, and c) to thicken the gate dielectric layer adjacent the gate sidewalls; and after subjecting the wafer to the oxidizing atmospheres, forming a second pair of diffusion regions within the semiconductive material adjacent the gate sidewalls.

2. The method of claim 1 wherein the semiconductive material substrate is provided as bulk monocrystalline silicon.

3. The method of claim 1 wherein the semiconductive material substrate is provided as a silicon-on-insulator layer.

4. The method of claim 1 wherein the gate dielectric layer comprises silicon dioxide.

5. The method of claim 1 wherein the pressure is less than or equal to about 30 atmospheres.

6. The method of claim 1 wherein the pressure is from about 15 atmospheres to about 25 atmospheres.

7. The method of claim 1 wherein the temperature is from about 650° C. to about 750° C.

8. The method of claim 1 wherein the effective time is less than or equal to about 30 minutes.

9. The method of claim 1 wherein the effective time is from about 5 minutes to about 30 minutes.

10. The method of claim 1 wherein the temperature is from about 650° C. to about 750° C., and the pressure is less than or equal to about 30 atmospheres.

11. The method of claim 1 wherein the temperature is from about 650° C. to about 750° C., and the pressure is from about 10 atmospheres to about 25 atmospheres.

12. A method of forming a field effect transistor, comprising the following steps:

forming a gate oxide layer over a semiconductive material substrate;

forming a transistor gate over the gate oxide layer, the gate having sidewalls;

forming a first pair of diffusion regions within the semiconductive material substrate adjacent the gate sidewalls, the first pair of diffusion regions comprising LDD regions;

after forming the LDD regions, subjecting the wafer to an oxidizing atmosphere at a pressure of at least about 5 atmospheres and at a temperature of less than or equal to about 750° C. for a period of time effective, a) to oxidize the gate sidewalls, b) to oxidize the semiconductive material substrate adjacent the gate sidewalls, and c) to thicken the gate oxide layer adjacent the gate sidewalls; and after subjecting the wafer to the oxidizing atmosphere, forming a second pair of diffusion regions within the semiconductive material adjacent the gate sidewalls.

13. The method of claim 12 wherein the semiconductive material substrate is provided as bulk monocrystalline silicon.

14. The method of claim 12 wherein the semiconductive material substrate is provided as a silicon-on-insulator layer.

15. The method of claim 12 wherein the gate dielectric layer comprises silicon dioxide.

16. The method of claim 12 wherein the pressure is less than or equal to about 30 atmospheres.

17. The method of claim 12 wherein the pressure is from about 15 atmospheres to about 25 atmospheres.

18. The method of claim 12 wherein the effective time is less than or equal to about 30 minutes.

19. The method of claim 12 wherein the effective time is from about 5 minutes to about 30 minutes.

20. A method of reducing diffusion of impurity dopants within a semiconductive material beneath a field effect transistor gate in a process of forming a field effect transistor, the method comprising the following steps:

providing a bulk monocrystalline silicon substrate;

providing a gate oxide layer over the silicon substrate;

providing a patterned gate over the gate oxide layer, the gate having sidewalls;

providing a first pair of diffusion regions within the silicon substrate adjacent the gate sidewalls;

subjecting the wafer to an oxidizing atmosphere at a pressure of from about 5 atmospheres to about 30 atmospheres and at a temperature of from about 650° C. to about 750° C. for a period of time from about 5 minutes to about 30 minutes effective, a) to oxidize the gate sidewalls, b) to oxidize the semiconductive material substrate adjacent the gate sidewalls, and c) to thicken the gate oxide layer adjacent the gate sidewalls; and after subjecting the wafer to the oxidizing atmosphere, forming a second pair of diffusion regions within the semiconductive material adjacent the gate sidewalls.

21. The method of claim 20 wherein the pressure is from about 15 atmospheres to about 25 atmospheres.

* * * * *